United States Patent
Mihara

(10) Patent No.: US 10,615,330 B1
(45) Date of Patent: Apr. 7, 2020

(54) PIEZOELECTRIC ELEMENT, ACTUATOR, AND LIQUID DROPLET EJECTION HEAD

(71) Applicant: Panasonic Intellectual Property Management Co., Ltd., Osaka (JP)

(72) Inventor: Kensuke Mihara, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 16/341,099

(22) PCT Filed: Jan. 26, 2018

(86) PCT No.: PCT/JP2018/002391
§ 371 (c)(1),
(2) Date: Apr. 11, 2019

(87) PCT Pub. No.: WO2018/150844
PCT Pub. Date: Aug. 23, 2018

(30) Foreign Application Priority Data

Feb. 16, 2017 (JP) ................... 2017-026597

(51) Int. Cl.
*H01L 41/187* (2006.01)
*B41J 2/14* (2006.01)
(52) U.S. Cl.
CPC ...... *H01L 41/1876* (2013.01); *B41J 2/14201* (2013.01); *H01L 41/187* (2013.01);
(Continued)
(58) Field of Classification Search
CPC .............. H01L 41/1876; H01L 41/187; H01L 41/1875; B41J 2/142; B41J 2/14233; C04B 2235/3232
See application file for complete search history.

(56) References Cited

U.S. PATENT DOCUMENTS 10,112,872 B2 * 10/2018 Doi ................. H01L 41/1876
2008/0079783 A1 4/2008 Fujii
(Continued)

FOREIGN PATENT DOCUMENTS

JP 4142705 B 9/2008
JP 4142706 B 9/2008
(Continued)

OTHER PUBLICATIONS

International Search Report of PCT application No. PCT/JP2018/002391 dated Apr. 10, 2018.
(Continued)

*Primary Examiner* — Geoffrey S Mruk
(74) *Attorney, Agent, or Firm* — McDermott Will & Emery LLP

(57) ABSTRACT

A piezoelectric element includes a lower electrode, an upper electrode, and a piezoelectric layer disposed between the lower and upper electrodes. The piezoelectric layer contains (niobium, manganese)-doped lead zirconate titanate. In the (niobium, manganese)-doped lead zirconate titanate, a ratio of the number of moles of niobium to a total of the number of moles of niobium, manganese, zirconium, and titanium is not less than 10% and is not more than 25%. The ratio of the number of moles of manganese to the total of the number of moles of niobium, manganese, zirconium, and titanium is not less than 0.3% and is not more than 1.2%. This piezoelectric element decreases an internal electric field therein.

4 Claims, 11 Drawing Sheets

(52) U.S. Cl.
CPC ....... *H01L 41/1875* (2013.01); *B41J 2/14233* (2013.01); *C04B 2235/3232* (2013.01)

(56) References Cited

U.S. PATENT DOCUMENTS

| | | |
|---|---|---|
| 2008/0081128 A1 | 4/2008 | Fujii |
| 2008/0081216 A1 | 4/2008 | Fujii et al. |
| 2008/0231667 A1 | 9/2008 | Arakawa et al. |
| 2009/0114875 A1 | 5/2009 | Arakawa |
| 2011/0012051 A1* | 1/2011 | Kaigawa ............... H01L 41/187 252/62.9 R |

FOREIGN PATENT DOCUMENTS

| | | |
|---|---|---|
| JP | 4246227 B | 4/2009 |
| JP | 4452752 B | 4/2010 |
| JP | 4505492 B | 7/2010 |
| JP | 5367242 B | 12/2013 |

OTHER PUBLICATIONS

R. Ramesh et al., "Effects of crystalline quality and electrode material on fatigue in Pb(Zr, Ti)O3 thin film capacitors", Appl. Phys. Lett. (1993) vol. 63, No. 1, pp. 27-29.

\* cited by examiner

FIG. 3

|  |  | Sample 1 | Sample 2 | Sample 3 | Sample 4 | Sample 5 | Sample 6 | Sample 7 |
|---|---|---|---|---|---|---|---|---|
| Mn/(Zr+Ti+Nb+Mn) | mol% | 0.0 | 0.3 | 0.6 | 1.2 | 2.0 | 0.0 | 0.6 |
| Nb/(Zr+Ti+Nb+Mn) | mol% | 10 | 10 | 10 | 10 | 10 | 20 | 20 |
| Internal Electric Field | kV/cm | 27.8 | 7.4 | 1.0 | 3.5 | 37.5 | 13.2 | 0.8 |
| Magnitude of Internal Electric Field |  | NG | F | G | G | NG | NG | G |

PIEZOELECTRIC ELEMENT, ACTUATOR, AND LIQUID DROPLET EJECTION HEAD

CROSS-REFERENCE TO RELATED APPLICATIONS

This application is a U.S. national stage application of the PCT international application No. PCT/JP2018/002391 filed on Jan. 26, 2018, which claims the benefit of foreign priority of Japanese patent application No. 2017-026597 filed on Feb. 16, 2017, the contents all of which are incorporated herein by reference.

TECHNICAL FIELD

The present disclosure relates to a piezoelectric element, an actuator including the piezoelectric element, and a liquid-droplet ejection head including the actuator.

BACKGROUND ART

In recent years, demands for printing on packages, textiles, and product decorations have increased. Inkjet printing is more advantageous than form-based printing in a small lot production and a shorter lead time. For this reason, the inkjet printing is regarded as a printing technique suitable for packages, textiles, and product decorations.

A liquid-droplet ejection head of inkjet printing includes an actuator for ejecting ink. The actuator employs, as a driver, a piezoelectric element in which electrodes are disposed on both major surfaces of a piezoelectric film mainly containing lead zirconate titanate.

Printing objects, such as packages, textiles, and product decorations have a less flat printing surface than printing objects, such as printing paper. Moreover, printing objects, such as packages, textiles, and product decorations, require more varieties of inks than printing objects, such as printing paper.

For this reason, the piezoelectric element requires higher piezoelectric performance so that the printing objects with non-flat printing surfaces can be printed at high speed and high resolution with various types of inks. A conventional technique for increasing the piezoelectric constant of lead zirconate titanate is the technique in which the piezoelectric film is made to have (001) preferential orientation and also lead zirconate titanate is doped with niobium in an amount of 10 mole % to 40 mole %.

Conventional techniques relating to the aforementioned piezoelectric element are disclosed in, e.g. PTLs 1-6.

Niobium-doped lead zirconate titanate may cause an internal electric field in the piezoelectric element.

A driver is often employed in a form of an actuator in which a substrate, a lower electrode, a piezoelectric film, and an upper electrode are stacked on one another. In the case that the piezoelectric film of this actuator is made of niobium-doped lead zirconate titanate, an internal electric field is produced in a direction from the lower electrode toward the upper electrode. For example, the value of the internal electric field, which is read from the polarization-electric field curve (P-E curve) disclosed in FIG. 7 of PTL 4, is 18 kV/cm.

NPL 1 describes that a sample having an internal electric field of 10-15 kV/cm causes, under a continuous operation, polarization deterioration earlier than a sample having no internal electric field.

PTLs 4 and 5 disclose a technique of reducing the internal electric field of the piezoelectric film by substituting lead ions with bismuth ions.

PTL 6 discloses a piezoelectric film in which the mole ratio of lead with respect to that of the cations other than lead is set to equal to or less than 1.03.

CITATION LIST

Patent Literature

PTL 1: Japanese Patent No. 4,142,705
PTL 2: Japanese Patent No. 4,142,706
PTL 3: Japanese Patent No. 4,246,227
PTL 4: Japanese Patent No. 5,367,242
PTL 5: Japanese Patent No. 4,505,492
PTL 6: Japanese Patent No. 4,452,752

Non-Patent Literature

NPL 1: R. Ramesh, Appl. Phys. Lett. (1993) Vol. 63, No. 1, pp. 27-29

SUMMARY

A piezoelectric element includes a lower electrode, an upper electrode, and a piezoelectric layer disposed between the lower and upper electrodes. The piezoelectric layer contains (niobium, manganese)-doped lead zirconate titanate. In the (niobium, manganese)-doped lead zirconate titanate, a ratio of the number of moles of niobium to a total of the number of moles of niobium, manganese, zirconium, and titanium is not less than 10% and is not more than 25%. The ratio of the number of moles of manganese to the total of the number of moles of niobium, manganese, zirconium, and titanium is not less than 0.3% and is not more than 1.2%.

This piezoelectric element decreases an internal electric field therein.

BRIEF DESCRIPTION OF DRAWINGS

FIG. 3 shows a doping ratio of Mn, a doping ratio of Nb, and an internal electric field of samples 1-7.

DETAIL DESCRIPTION OF PREFERRED EMBODIMENT

Figure 1:
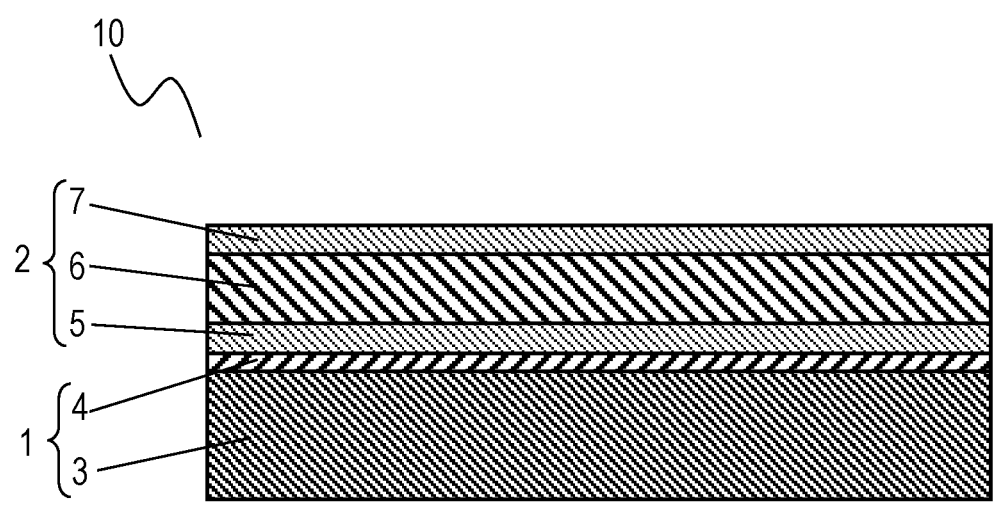
FIG. 1 is a cross-sectional view of an actuator including a piezoelectric element according to an exemplary embodiment.

An actuator including a piezoelectric element according to an exemplary embodiment of the present disclosure will be described below with reference to the drawings. Note that the embodiment described below illustrates a specific example of the present disclosure. Accordingly, the shapes, structural elements, arrangements and connections of the structural elements, etc. shown in the following exemplary embodiment are merely examples, and therefore do not limit the scope of the present disclosure. Therefore, among the constituent elements in the following exemplary embodiment, those not recited in any one of the independent claims which indicate the broadest inventive concepts of the present invention are described as optional elements.

The drawings are schematic and do not necessarily depict the elements exactly. In the drawings, substantially the same parts are designated by the same reference numerals, and the repetitive description thereof may be omitted or simplified.

FIG. 1 is a cross-sectional view of actuator 10. Actuator 10 includes diaphragm 1 and piezoelectric element 2. Piezoelectric element 2 is disposed on diaphragm 1. Piezoelectric element 2 includes lower electrode 5, piezoelectric layer 6, and upper electrode 7.

Diaphragm 1 may be made of a multi-layer substrate including silicon substrate 3 and insulation film 4 disposed on silicon substrate 3. Insulation film 4 is made of silicon dioxide.

Lower electrode 5 is disposed on insulation film 4. Lower electrode 5 is made of metal, such as platinum or iridium. An adhesion layer may be disposed between insulation film 4 and lower electrode 5. The adhesion layer is made of titanium and chromium. Lower electrode 5 and the adhesion layer may be formed by a commonly known film deposition method, such as sputtering, vacuum deposition, chemical vapor deposition (CVD), or chemical solution deposition (CSD).

Piezoelectric layer 6 is made of, i.e., contains lead zirconate titanate doped with niobium and manganese (hereinafter referred to as Nb, Mn-doped PZT).

Piezoelectric layer 6 has (001) preferential orientation. An orientation control layer may be disposed between lower electrode 5 and piezoelectric layer 6. The orientation control layer is made of perobskite oxide, such as lead titanate, lanthanum-doped lead titanate, or lanthanum nickel oxide, having a lattice constant similar to that of piezoelectric layer 6. Piezoelectric layer 6 and the orientation control layer may be formed by a commonly known film deposition method, such as sputtering, CVD, CSD, or pulsed laser deposition (PLD). For example, in the case that piezoelectric layer 6 is formed by sputtering, a target material of the sputtering mainly contains lead zirconate titanate, and is doped with niobium oxide, manganese oxide, and lead oxide so as to provide a predetermined composition of piezoelectric layer 6. In piezoelectric layer 6 mainly made of lead zirconate titanate, the piezoelectric performance increases at morphotropic phase boundary (MPB), as is commonly known. The mole ratio Zr/Ti in piezoelectric layer 6 may be preferably range from 40/60 to 60/40.

The doping ratio of niobium (Nb) in the (Nb, Mn)-doped PZT may be preferably not less than 10% and not more than 25%. The doping ratio of Nb within this range enhances a piezoelectric performance of piezoelectric element 2. The doping ratio of Nb is the ratio of the number of moles of Nb to the total of the number of moles of Nb, Mn, Zr, Ti that constitute the (Nb, Mn)-doped PZT.

The doping ratio of Mn in the (Nb, Mn)-doped PZT may be preferably not less than 0.3% and not more than 1.2%. The doping ratio of Mn within this range reduces internal electric field in piezoelectric element 2. Decreasing of the internal electric field in piezoelectric element 2 prevents actuator 10 from deterioration of piezoelectric performance when operated continuously. The doping ratio of Mn is the ratio of the number of moles of Nb to the total of the number of moles of Nb, Mn, Zr, Ti that constitute the (Nb, Mn)-doped PZT.

Upper electrode 7 is disposed on piezoelectric layer 6. Upper electrode 7 is made of metal, such as platinum or gold. An adhesion layer may be disposed between upper electrode 7 and piezoelectric layer 6. Upper electrode 7 and the adhesion layer are formed by a commonly known film deposition method, such as sputtering, vacuum deposition, CVD, or CSD.

An operation to drive actuator 10 will be described below. Diaphragm 1 of actuator 10 vibrates upon receiving a control voltage applied between upper electrode 7 and lower electrode 5. The control voltage causes diaphragm 1 to vibrate in a direction along the thickness of piezoelectric element 2, i.e., in the direction in which upper electrode 7, piezoelectric layer 6, and lower electrode 5 are stacked on one another, due to the inverse piezoelectric effect of piezoelectric layer 6.

As described above, the drive voltage applied to piezoelectric element 2 driving actuator 10 is high, and accordingly, the advantageous effects obtained by reducing the internal electric field are significant. When actuator 10 is used as an ink ejecting device of a printer, the advantageous effects due to the reduction of the internal electric field will be more significant.

Figure 2:
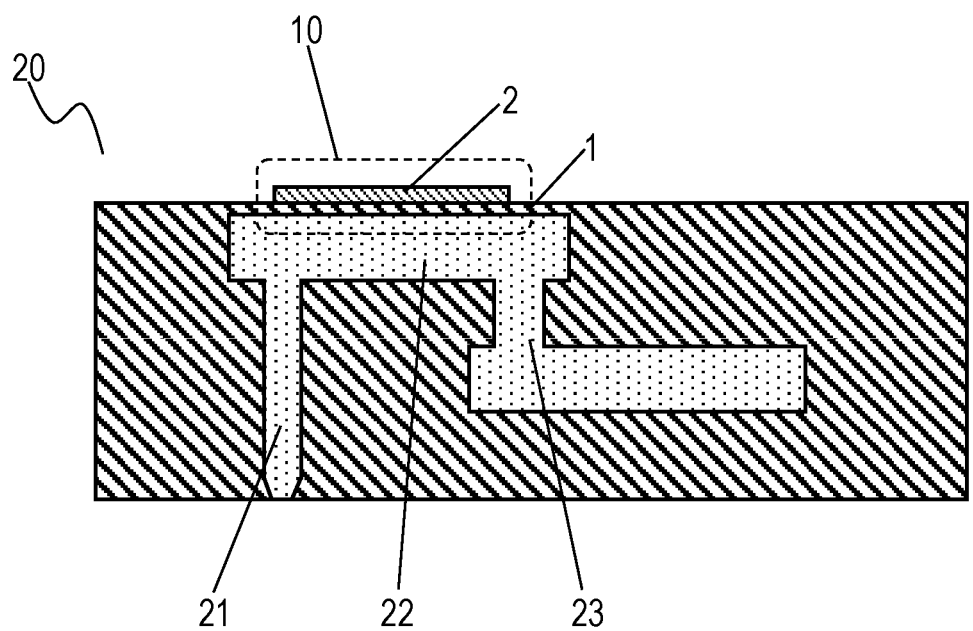
FIG. 2 is a cross-sectional view of a liquid-droplet ejection head including the actuator according to the embodiment.

Advantageous effects of actuator 10 of the present disclosure for a liquid-droplet ejection head will be described below. The liquid-droplet ejection head functions as an ejection device of a printer. FIG. 2 shows a structure of liquid-droplet ejection head 20. Liquid-droplet ejection head 20 includes nozzle 21 configured to eject ink, pressure chamber 22 configured to control a pressure at which the ink is ejected, and flow passage 23 configured to introduce the ink into pressure chamber 22. Pressure chamber 22 includes actuator 10 of the present disclosure. Actuator 10 includes diaphragm 1 and piezoelectric element 2. Diaphragm 1 of actuator 10 constitutes a ceiling of pressure chamber 22. When a drive signal is applied to actuator 10, diaphragm 1 changes its shape, and accordingly, applies an ejection pressure to the ink inside pressure chamber 22, thereby ejecting the ink through nozzle 21. For ejecting the ink, actuator 10 applies a pressure enough for ejecting highly viscous ink, and therefore, actuator 10 has high piezoelectric performance capable of causing a larger change in the shape of diaphragm 1. That is, the reduction of the internal electric field achieved by the present disclosure produces significantly advantageous effects.

An inventor carried out an experiment on (Nb, Mn)-doped PZT to examine the relation between the doping ratio of Nb, the doping ratio of Mn, and the internal electric field. In the experiment, samples of actuator 10 in which piezoelectric element 2 is disposed on diaphragm 1 were prepared and measured in the internal electric field to evaluate each sample.

The samples have the same structure of actuator 10, but has a different combination of the doping ratio of Mn and the doping ratio of Nb in the (Nb, Mn)-doped PZT. The composition of the (Nb, Mn)-doped PZT is determined by, for example, X-ray photoelectron spectroscopy (XPS), energydispersive X-ray spectroscopy (SEM-EDX), or high-frequency inductively coupled plasma emission spectroscopy (ICP).

In actuator 10 of each sample, diaphragm 1 has a two-layer substrate in which insulation film 4 made of silicon dioxide is disposed on silicon substrate 3. Silicon substrate 3 has a thickness of 525 µm and insulation film 4 has a thickness of 70 nm. Lower electrode 5 is made of platinum, and has a thickness of 0.4 µm. Piezoelectric layer 6 is made of (Nb, Mn)-doped PZT. Piezoelectric layer 6 has a thickness of 3.5 µm. Upper electrode 7 is made of gold, and has a thickness of 0.3 µm.

FIG. 3 shows the doping ratio of Mn and Nb of samples 1-7.

Figure 4:
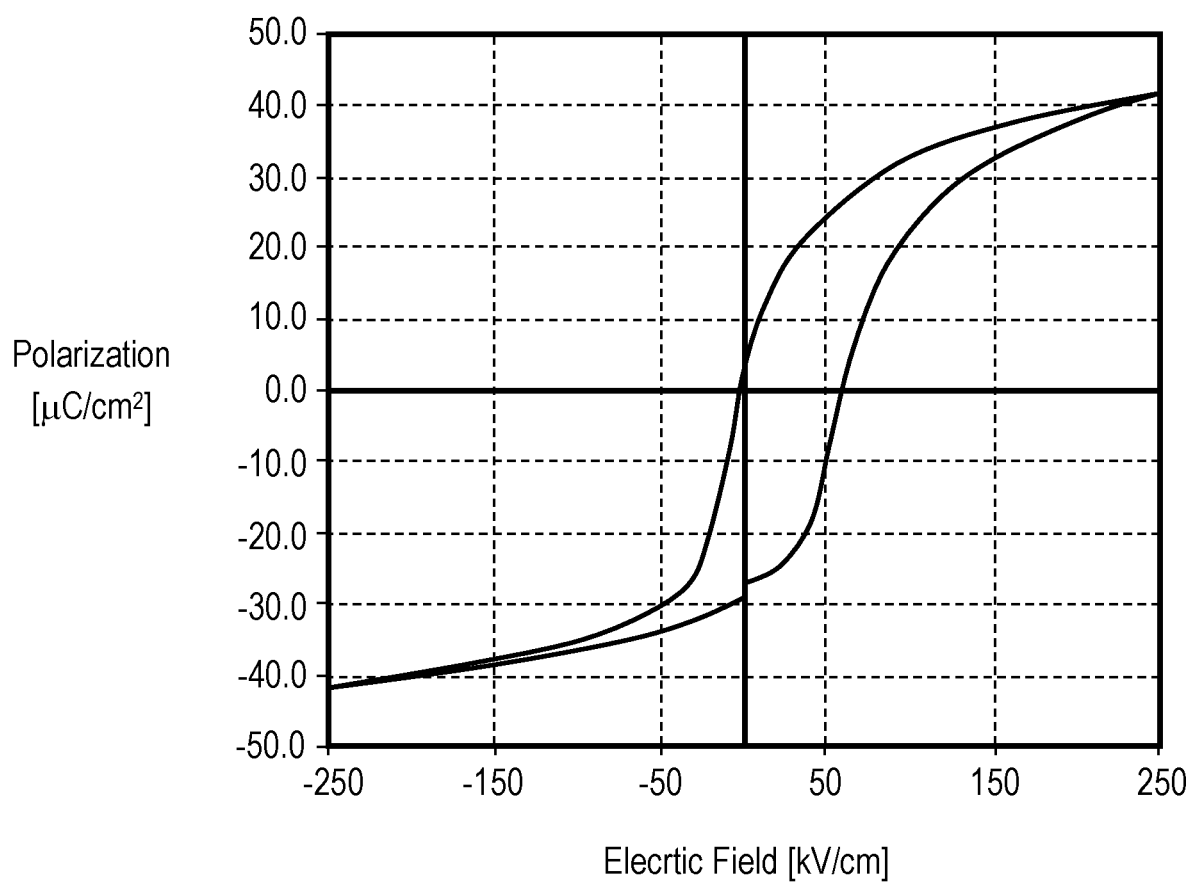
FIG. 4 shows a hysteresis curve of a sample of the piezoelectric element of according to the embodiment.
Figure 5:
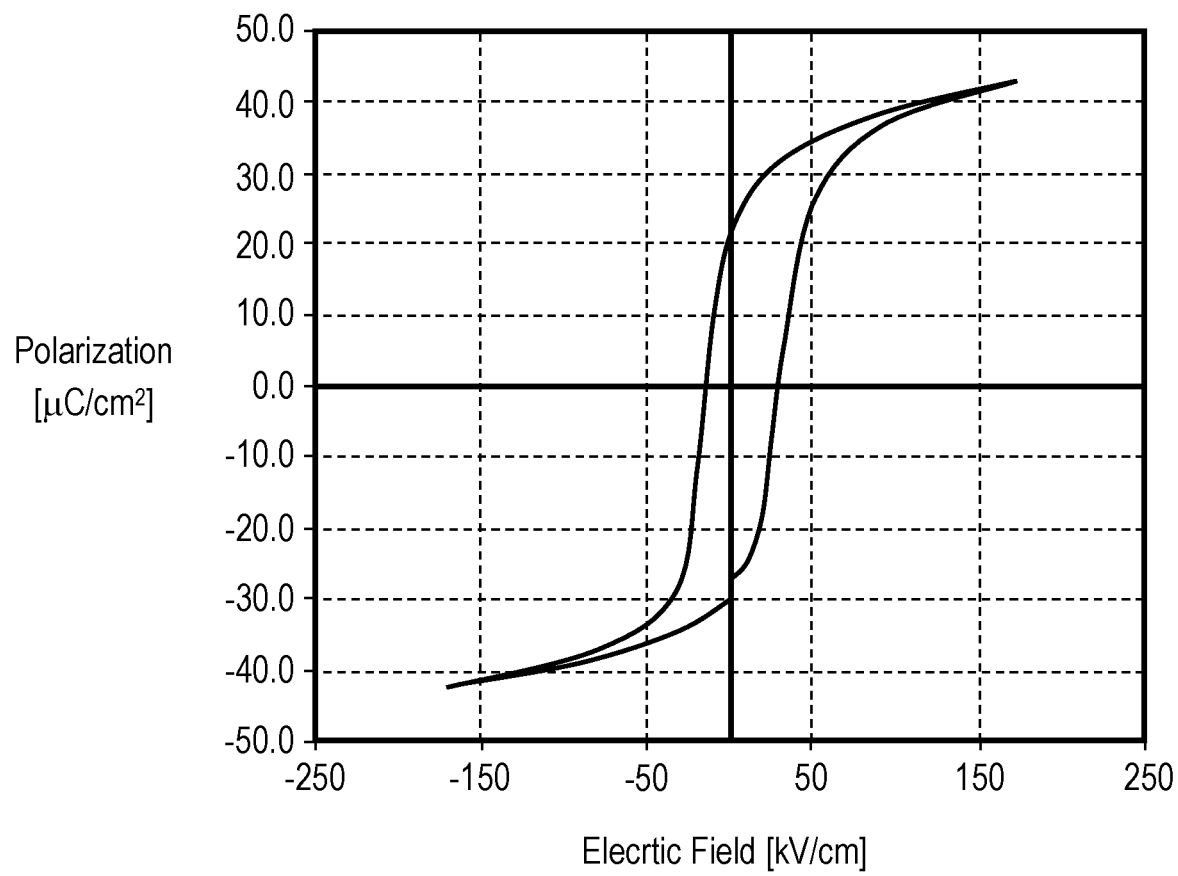
FIG. 5 shows a hysteresis curve of a sample of the piezoelectric element of according to the embodiment.
Figure 6:
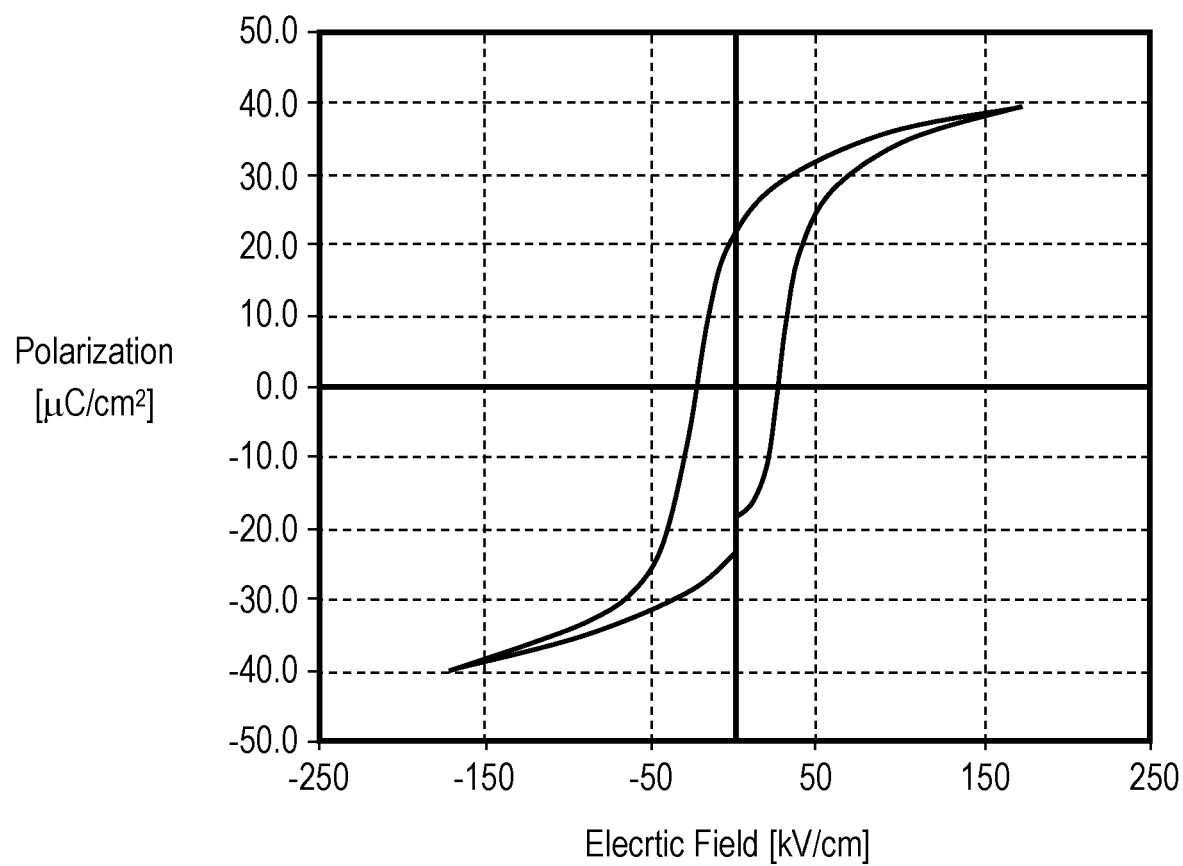
FIG. 6 shows a hysteresis curve of a sample of the piezoelectric element of according to the embodiment.
Figure 7:
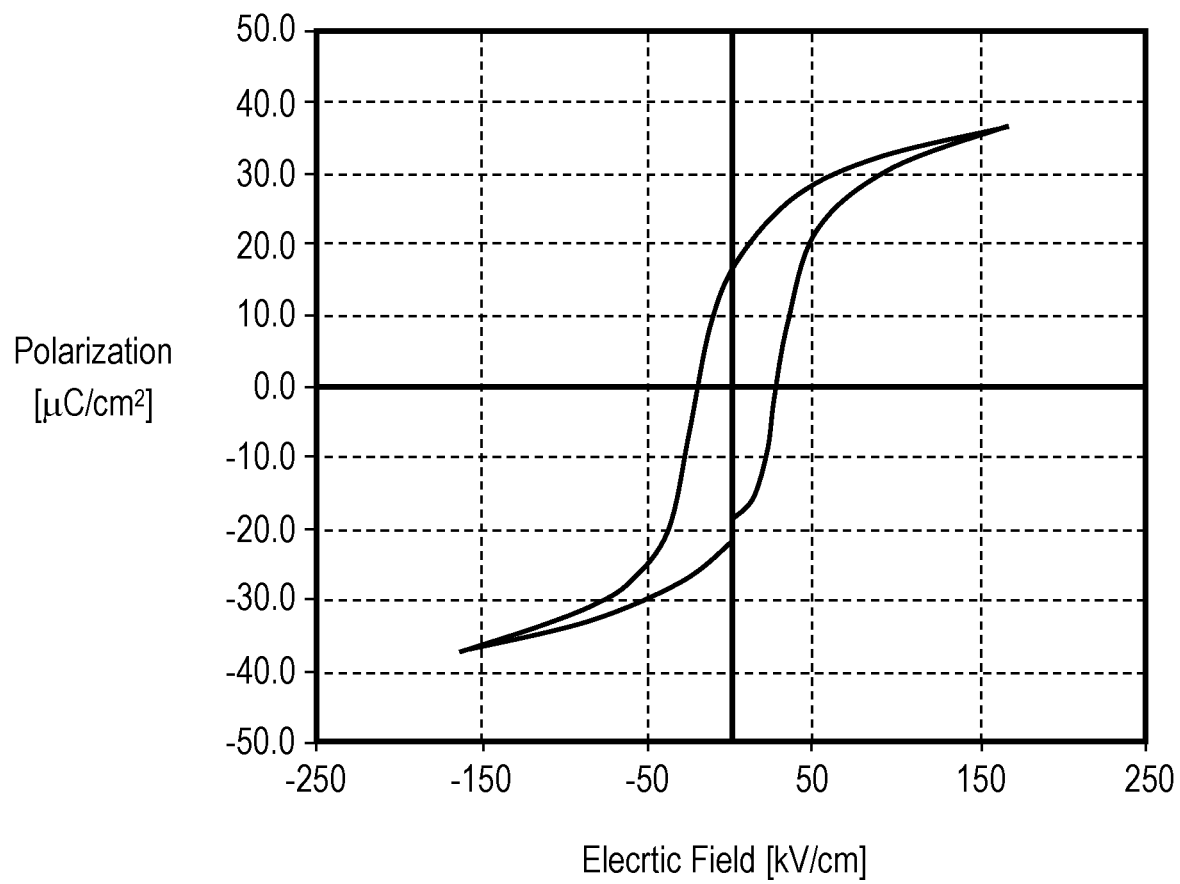
FIG. 7 shows a hysteresis curve of a sample of the piezoelectric element of according to the embodiment.
Figure 8:
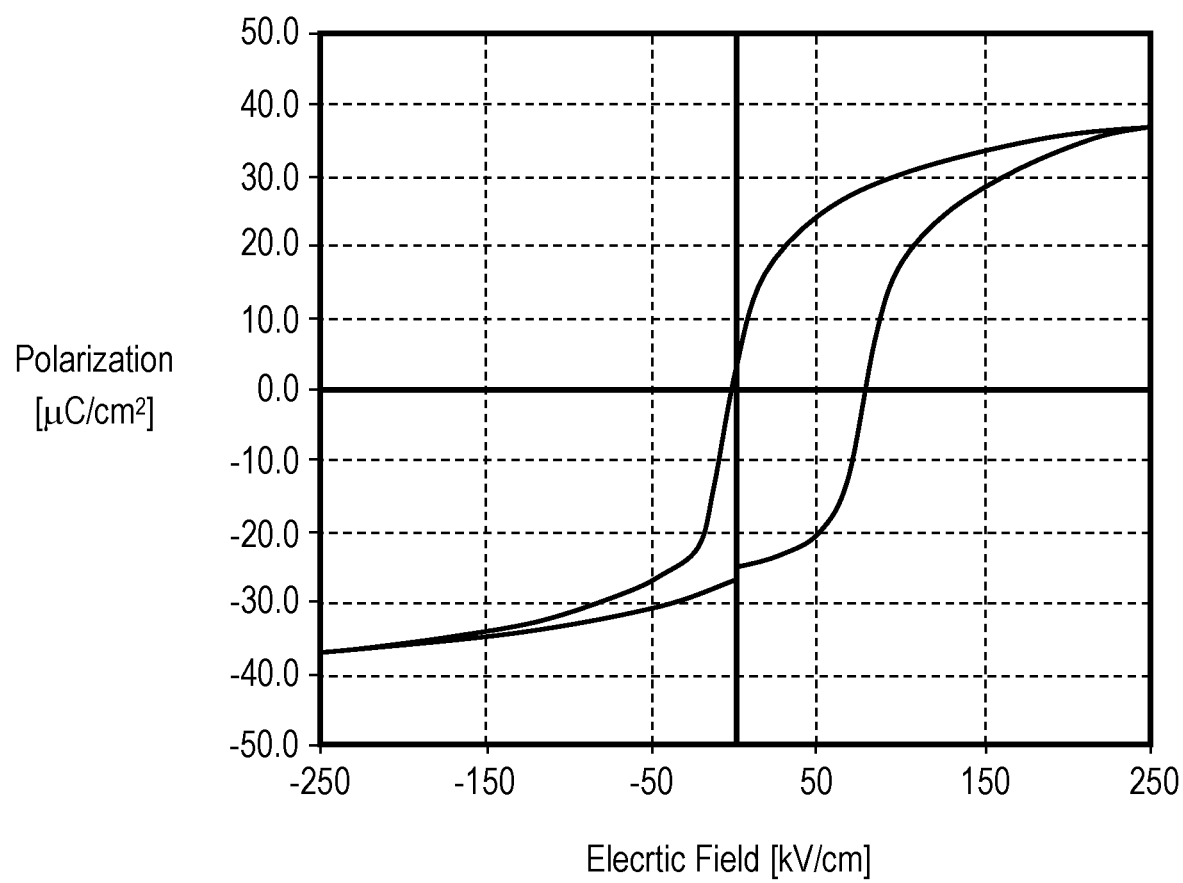
FIG. 8 shows a hysteresis curve of a sample of the piezoelectric element of according to the embodiment.
Figure 9:
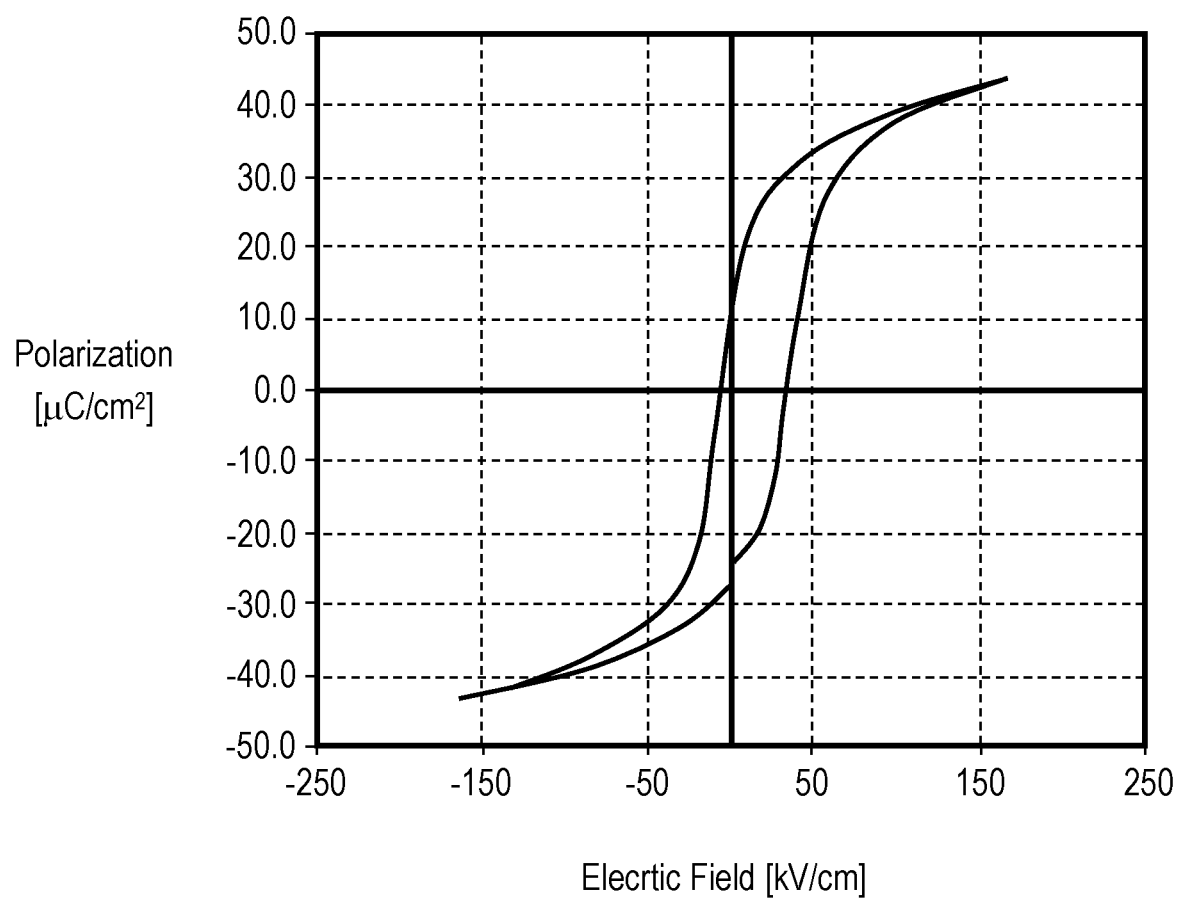
FIG. 9 shows a hysteresis curve of a sample of the piezoelectric element of according to the embodiment.
Figure 10:
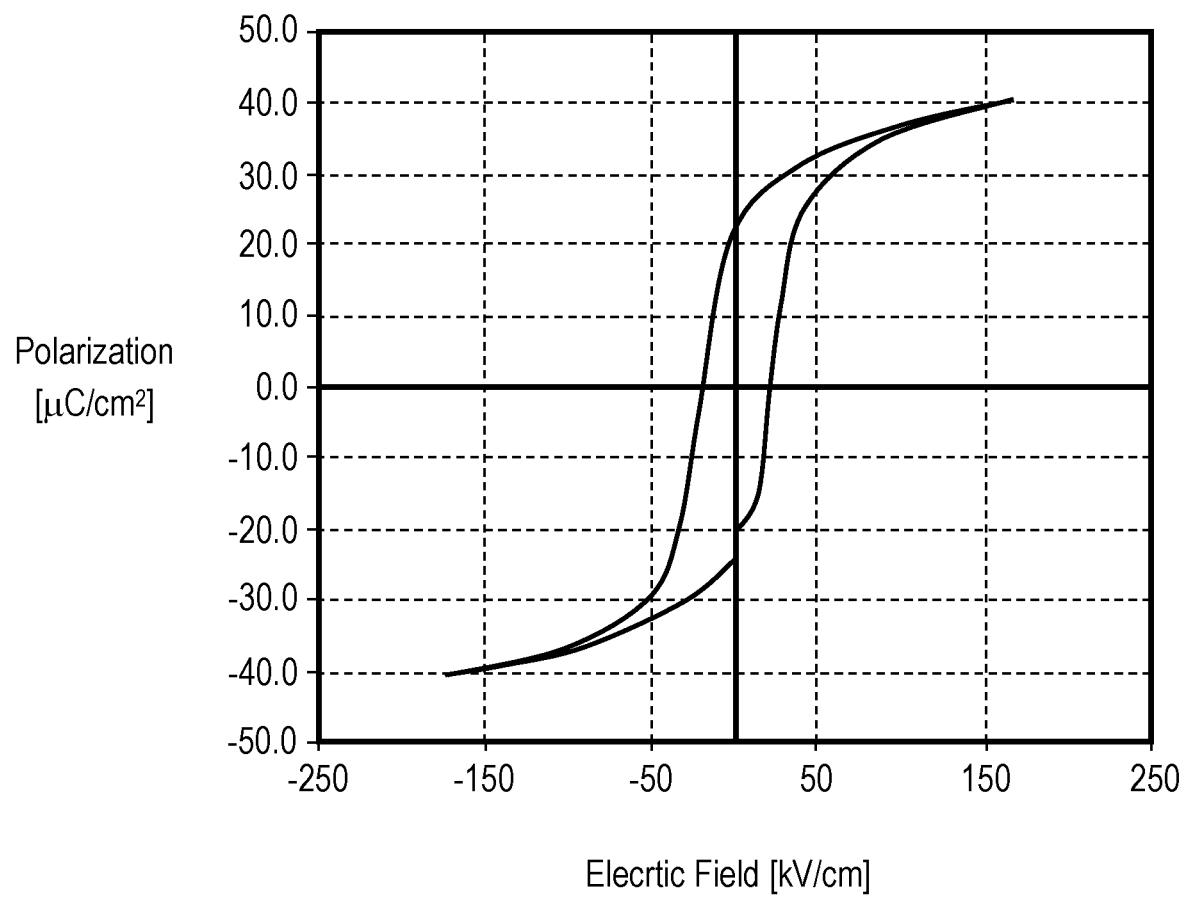
FIG. 10 shows a hysteresis curve of a sample of the piezoelectric element of according to the embodiment.

Sample 1 is doped with 10% of Nb and 0% of Mn, i.e., piezoelectric layer 6 of sample 1 is not doped with Mn. FIG. 4 shows the hysteresis curve of sample 1. Sample 2 is doped with 10% of Nb and 0.3% of Mn. FIG. 5 shows the hysteresis curve of sample 2. Sample 3 is doped with 10% of Nb and 0.6% of Mn. FIG. 6 shows the hysteresis curve of sample 3. Sample 4 is doped with 10% of Nb and 1.2% of Mn. FIG. 7 shows the hysteresis curve of sample 4. Sample 5 is doped with 10% of Nb and 2% of Mn. FIG. 8 shows the hysteresis curve of sample 5. Sample 6 is doped with 20% of Nb and 0% of Mn, i.e., piezoelectric layer 6 of sample 6 is not doped with Mn. FIG. 9 shows the hysteresis curve of sample 6. Sample 7 is doped with 20% of Nb and 0.6% of Mn. FIG. 10 shows the hysteresis curve of sample 7.

Figure 11:
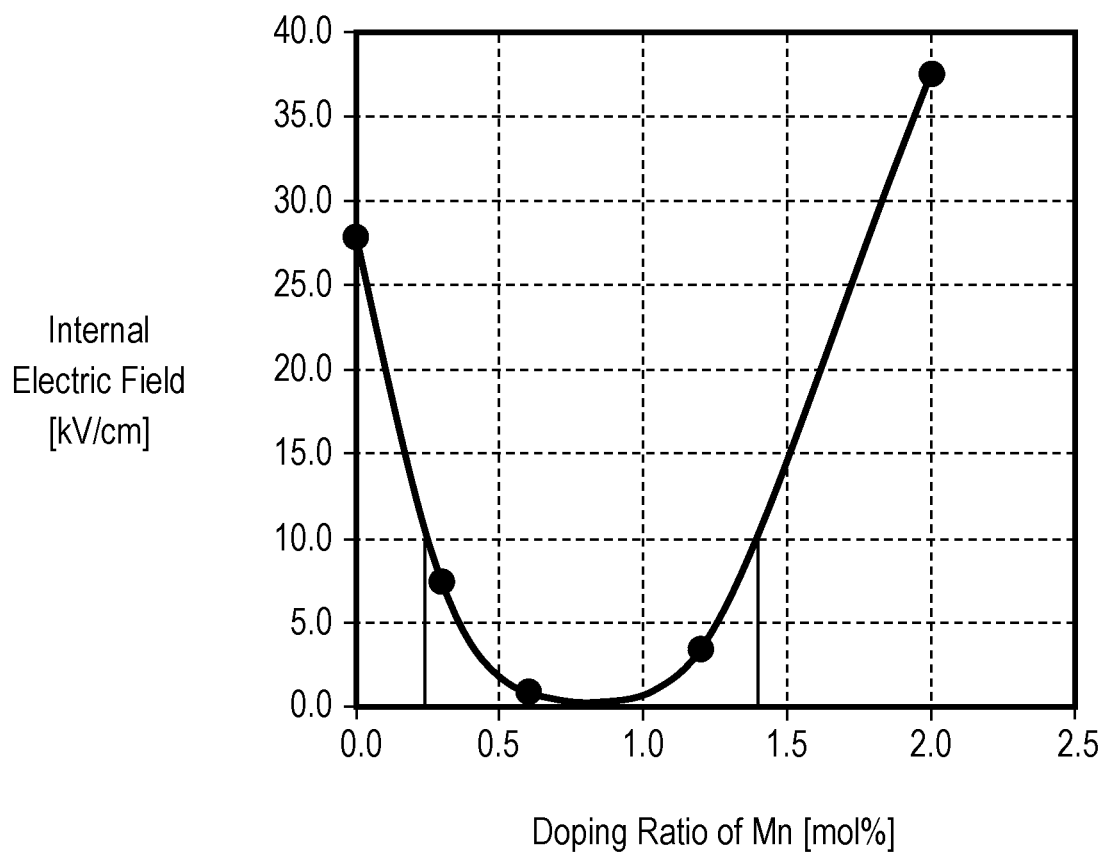
FIG. 11 shows a hysteresis curve of a sample of the piezoelectric element of according to the embodiment.

FIG. 11 shows the relation between the doping ratio of Mn and the internal electric field in samples 1-5 having the same doping ratio of Nb. In FIG. 11, the horizontal axis represents the doping ratio (mole %) of Mn and the vertical axis represents values (kV/cm) of the internal electric field. FIG. 11 shows an approximate curve based on the plots of measurement values of samples 1-5. The internal electric field of actuator 10 is preferably not more than 10 kV/cm; more preferably, not more than 5 kV/cm. FIG. 3 shows evaluation results of measurement values of the internal electric field in samples 1-7. In FIG. 3, the letter "F" denotes a preferable internal electric field, the letter "G" denotes a more preferable internal electric field, and the letter "NG" denotes an unpreferable internal electric field. FIG. 3 and FIG. 11 show that the internal electric field of samples 2, 3, and 4 stays in the preferable range, i.e., not more than 10 kV/cm, for actuator 10. The approximate curve is a quadratic curve that is convex downward. The internal electric field is kept at not more than 10 kV/cm in the range that the doping ratio of Mn is not less than 0.3% and not more than 1.2%. The internal electric field of samples 3 and 4 stays in a more preferable range, i.e., not more than 5 kV/cm, for actuator 10. The internal electric field is kept at not more than 5 kV/cm in the range that the doping ratio of Mn is not less than 0.5% and not more than 1.2%.

Sample 6 is doped with 0% of Mn, i.e., the doping ratio of Mn is outside of the aforementioned range, i.e., not less than 0.3% and not more than 1.2%, and the value of the internal electric field exceeds 10 kV/cm, resulting in the status denoted by "NG". Sample 7 is doped with 0.6% of Mn, i.e., the doping ratio of Mn is within the range above and the value of the internal electric field is less than 10 kV/cm, which is evaluated as "G".

In a piezoelectric film, such as a film made of lead zirconate titanate, having ferroelectricity described in NPL 1, the polarization correlates to the piezoelectric performance. Therefore, it is expected that an actuator including a piezoelectric film made of niobium-doped lead zirconate titanate causes deterioration of the piezoelectric performance of the piezoelectric film at an early stage when operated continuously.

PTL 4 and PTL 5 disclose a technique of reducing the internal electric field of the piezoelectric film by substituting lead ions with bismuth ions. However, this technique requires larger amounts of doping material to the piezoelectric film, inviting a complicated control of the composition of the piezoelectric film. For this reason, this technique is undesirable from the viewpoint of mass production.

PTL 6 discloses a piezoelectric film in which the mole ratio of lead to that of cations other than lead is equal to or less than 1.03. This causes degradation of ferroelectricity and is thus undesirable.

In contrast, in piezoelectric element 2 according to the embodiment, i.e., piezoelectric element 2 having piezoelectric layer 6 made of the (Nb, Mn)-doped PZT, as shown in the experimental result, controlling the doping ratio of Mn controls the intensity of internal electric field regardless of the doping ratio of Nb.

Throughout the description of the embodiment, terms, such as "upper electrode" and "lower electrode2, indicating directions merely indicate relative directions determined by only a relative positional relation of components of the piezoelectric element, and do not indicate absolute directions, such as a vertical direction.

INDUSTRIAL APPLICABILITY

The structure of the present disclosure is useful especially for actuator applications that require a high piezoelectric constant.

REFERENCE MARKS IN THE DRAWINGS 1 diaphragm
2 piezoelectric element
4 lower electrode
6 piezoelectric layer
7 upper electrode
21 nozzle
22 pressure chamber
23 flow passage
10 actuator
20 liquid-droplet ejection head

The invention claimed is:
1. A piezoelectric element comprising:
a lower electrode;
an upper electrode; and
a piezoelectric layer disposed between the lower electrode and the upper electrode,
wherein the piezoelectric layer contains (niobium, manganese)-doped lead zirconate titanate,
wherein, in the (niobium, manganese)-doped lead zirconate titanate, a ratio of the number of moles of niobium to a total of the number of moles of niobium, manganese, zirconium, and titanium is not less than 10% and is not more than 25%, and
wherein a ratio of the number of moles of manganese to the total of the number of moles of niobium, manganese, zirconium, and titanium is not less than 0.3% and is not more than 1.2%.
2. The piezoelectric element of claim 1, wherein the ratio of the number of moles of manganese to the total of the number of moles of niobium, manganese, zirconium, and titanium is not less than 0.5%.

3. An actuator comprising:
a substrate; and
a piezoelectric element disposed on the substrate,
wherein the piezoelectric element includes:
  a lower electrode;
  an upper electrode; and
  a piezoelectric layer disposed between the lower electrode and the upper electrode,
wherein the piezoelectric layer contains (niobium, manganese)-doped lead zirconate titanate,
wherein, in the (niobium, manganese)-doped lead zirconate titanate, a ratio of the number of moles of niobium to a total of the number of moles of niobium, manganese, zirconium, and titanium is not less than 10% and is not more than 25%, and
wherein a ratio of the number of moles of manganese to the total of the number of moles of niobium, manganese, zirconium, and titanium is not less than 0.3% and is not more than 1.2%.

4. A liquid-droplet ejection head comprising:
a flow passage;
a pressure chamber connected to the flow passage; and
a nozzle connected to the pressure chamber,
wherein the pressure chamber includes an actuator configured to control a pressure in the pressure chamber,
wherein the actuator includes:
  a substrate; and
  a piezoelectric element disposed on the substrate,
wherein the piezoelectric element includes:
  a lower electrode;
  an upper electrode; and
  a piezoelectric layer disposed between the lower electrode and the upper electrode,
wherein the piezoelectric layer contains (niobium, manganese)-doped lead zirconate titanate,
wherein, in the (niobium, manganese)-doped lead zirconate titanate, a ratio of the number of moles of niobium to a total of the number of moles of niobium, manganese, zirconium, and titanium is not less than 10% and is not more than 25%, and
wherein a ratio of the number of moles of manganese to the total of the number of moles of niobium, manganese, zirconium, and titanium is not less than 0.3% and is not more than 1.2%.

* * * * *